INVENTOR.
Lowell E. Clark
BY Mueller & Aichele
ATT'YS.

UNIJUNCTION TRANSISTOR

Filed March 26, 1964 2 Sheets-Sheet 2

INVENTOR.
Lowell E. Clark

BY Mueller & Aichele

ATT'YS.

3,325,705

UNIJUNCTION TRANSISTOR

Lowell E. Clark, Phoenix, Ariz., assignor to Motorola, Inc., Franklin Park, Ill., a corporation of Illinois Filed Mar. 26, 1964, Ser. No. 354,934
5 Claims. (Cl. 317—235)

This invention relates to the semiconductor art. Particularly it relates to an improvement in the design of silicon unijunction transistors.

The unijunction transistor is a switching device which consists of a single rectifying emitter region and first and second base regions $B_1$ and $B_2$ on a semi-conductor die of high resistivity. The three regions are so arranged on the die that when a steady interbase voltage $V_{BB}$ is applied across the base contacts, a negative resistance is provided between the emitter and the first base $B_1$ when the emitter voltage $V_E$ is greater than a certain critical value $V_P$ which is called the emitter peak point voltage or standoff voltage. In the "off" condition, until $V_E$ reaches the value $V_P$, the emitter junction is reverse biased and only reverse current $I_{eo}$ will flow from the emitter to the base $B_1$. The device turns "on" when $V_P$ is reached; when $V_E$ reaches $V_P$, minority carriers are injected by the emitter into the first or closed base region thereby modulating (increasing) the conductivity of the first base region so that the emitter current $I_e$ increases as emitter voltage falls. The emitter current will continue to increase until $V_E$ reaches a critical low value at which the emitter ceases to inject minority carriers. If the emitter current is limited so that $V_E$ is kept at a value greater than the critical low value the emitter junction will continue to conduct.

The standoff voltage of the unijunction transistor varies $$V_P = \eta V_{BB} + V_D$$

$\eta$ is the intrinsic standoff ratio which is independent of bias conditions and temperature. $V_D$, called the equivalent emitter diode voltage, is temperature dependent and in most circuits utilizing unijunction transistors it is compensated for, so that the temperature variation of $V_P$ is substantially less than that of $V_D$.

Unijunction transistors are used as low current switches and for most applications only a very small current flow is permissible in the off condition to provide the voltage division which sets the value of $V_P$. It is necessary that the reverse current $I_{eo}$ across the emitter unction be kept at a very low value since the emitter reverse current affects the voltage $V_P$, and the associated standoff current $I_P$, so that large $I_{eo}$ may result in lack of control over these parameters.

There are two basic types of unijunction transistors in general use at the present time. Neither is easy to manufacture at low cost. Both types have performance limitations and one type is relatively unreliable.

The emitter of each of these devices is of the unpassivated alloyed type and at the present state of the art no satisfactory method for passivating these alloyed PN junctions is available. A large percentage of the manufactured products of an alloyed unijunction transistor line will be found to have high $I_{eo}$. As a result, a large percentage of the devices being manufactured do not meet $V_P$ specification and are rejected.

Of the two unijunction transistor types, the first is comprised of a bar of silicon with a base region at each end of the bar and an alloyed emitter between the base contacts. The second type consists of a small wafer of semiconductor material with alloyed emitter contact and the base contact $B_1$ on one major face, and with the other base contact $B_2$ on the opposite face. In either of these two types the placement of the emitter on the semiconductor is critical since its location determines the standoff ratio of the device and thus the standoff voltage $V_P$ for a given interbase voltage $V_{BB}$.

To obtain the desired standoff ratio in the first type unijunction transistor, a relatively large bar is used so that the bases may be widely separated and the positioning of the emitter facilitated. In most cases the emitter-to-base $B_1$ spacing will be so large that, to provide satisfactory conductivity modulation of the entire region, very high lifetime semiconductor material is necessary in order that minority carriers injected by the emitter reach the base $B_1$ instead of recombining elsewhere. The problem of recombination on the other hand limits the size of the bar that can be used so that the problem of physically spacing the emitter relative to the bases con only be partially solved.

When the bar size is increased, other related problems must be considered more fully. For example, considerable recombination occurs because of the large surface and therefore very high resistivity material must be used to increase the emitter efficiency and the minority carrier lifetime so that a large modulation is obtained. The use of high resistivity material, while partially resolving one problem, leads to still others.

As compared to low resistivity semiconductor material, the surface recombination velocity of very high resistivity silicon and germanium is relatively uncontrollable in processing and unstable for typical operating environments; since the conductivity modulation of the device will vary with changes in recombination conditions at the surface, this type unijunction transistor is not especially reliable or reproducible.

The unijunction transistor of the second type has most of the problems associated with the first type except that for an equivalent device it is much smaller. It also has considerably less surface about the silicon between the emitter and $B_1$ and base therefore is less affected by variations in the surface recombination velocity. It is, however, difficult to manufacture on a reproducible basis. As in any unijunction device, the interbase biasing voltage $V_{BB}$ gives rise to equipotentials established by the base contacts and to achieve a desired standoff ratio and voltage, the emitter must be placed on the appropriate equipotential line. While locating or calculating the proper position for the emitter would appear to be straightforward, it cannot be predicted exactly in this device since distortions in the shape of the surfaces and lines occur near the surface of the semiconductor die due to a variety of surface conditions. These conditions, at the present state of the art, are not well understood or controlled so that the exact position in which to place the emitter cannot be accurately predicted. When a large quantity of devices of this type is manufactured to a given standoff ratio specification, the result, more often than not, is a wide standoff ratio distribution among the devices, only a small percentage of which are acceptably close to specifications. As a result of this problem, unijunction transistors of this type are expensive to manufacture since the cost of manufacturing the acceptable devices will normally include the manufacturing cost of those devices which are unacceptable.

One of the objects of this invention is to provide a unijunction transistor which may be manufactured at a lower cost than present unijunction transistor types.

Another object is to provide a unijunction transistor design which is more reproducible with respect to specified operational characteristics on a sustained production basis.

Another object of the invention is to provide a unijunction transistor which is readily manufacturable with a small percentage of rejects at high production levels.

Still another object of the invention is to provide a unijunction transistor which is more reliable than present unijunction transistor types.

A feature of this invention is a design such that the standoff ratio of the unijunction transistor may be determined by the relative sizes of the base regions rather than by critical limitations on the location of the emitter.

Another feature of the invention is an emitter junction which is formed by solid state diffusion and is passivated so that the device will be more reliable and the reverse current $I_{eo}$ will be lower on the average.

A unijunction transistor in accordance with this invention comprises a semiconductor die which has one one of its major faces an emitter and two base regions $B_1$ and $B_2$, approximately circular in shape and of diameters which depend upon the desired standoff ratio according to the relationship $$\eta \cong \frac{d_2}{d_1+d_2}$$

where $d_1$ is the diameter of base $B_1$, and $d_2$ is the diameter of base $B_2$. In this device, the position of the emitter region is not critical as long as it is several base region diameters from each base region and each base region is substantially smaller than the semiconductor die. The device is prepared by solid state diffusion techniques and is oxide passivated for surface stability and low reverse current amplitudes.

Figure 1:
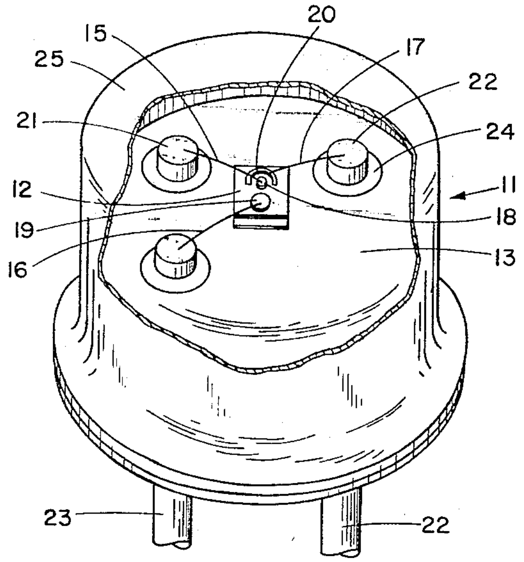
FIG. 1 is a cutaway view of the completed unijunction transistor, which is an embodiment of this invention.

The embodiment of the invention shown in FIG. 1 is a cutaway view of a complete unijunction transistor 11. It is comprised of an active element 12 mounted on the metal body 13 of an ordinary transistor header. Thin wires 15, 16 and 17 connect metal base electrodes 18 and 19 and the emitter electrode 20 of the active element 12 to the heavier wires 21, 22 and 23 of the header. The insulation material 24 between these wires and the body of the header 13 is glass. In the completed device, the active element is protected within a hermetically sealed enclosure provided by a can 25 which has been welded to the body 13 of the header.

Figure 2:
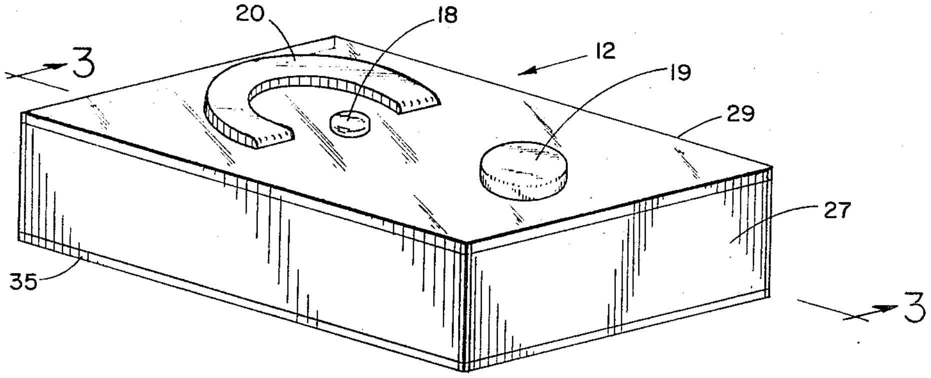
FIG. 2 is an isometric view of the active semiconductor element of the unijunction transistor of FIG. 1.

The active element is shown greatly enlarged in FIG. 2. This figure shows more clearly an N type silicon substrate region 27, a passivating film of silicon dioxide 29, the first base electrode 18, the second base electrode 19, the emitter electrode 20 and a metal film 35 which serves to facilitate soldering the element to the body 13 of the header. Note that the emitter region is not located between the two base regions 37 ($B_1$) and 38 ($B_2$). While the emitter region may be placed between the two base regions, the result is that it modulates the resistivity between the base regions so that there is considerable current flow at the base $B_2$, and this is undesirable in most applications. The two base regions and the emitter region were prepared by selective solid state diffusion.

Figure 3:
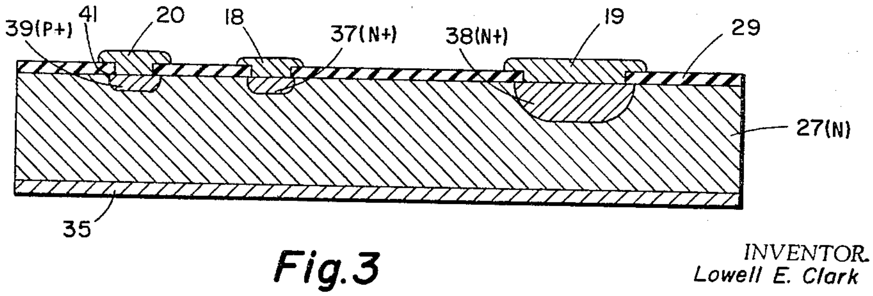
FIG. 3 is a sectional view of FIG. 2 taken at line 3—3.

The sectional view, FIG. 3, was taken at section line 3—3 of FIG. 2 to show the first and second N+ base regions 37 ($B_1$) and 38 ($B_2$) beneath the metal base electrodes 18 and 19 and the P+ emitter region 39 beneath the emitter electrode 20. The oxide film 29 which covers the surface of the device and the PN junction 41 at the surface serves to passivate or stabilize the device and keep the emitter-to-base reverse current $I_{eo}$ at a low value.

The basic structure of the active element shown in FIGS. 2 and 3 is well-suited for incorporation into monolithic integrated circuits. For a unijunction transistor to be compatible with current integrated circuit technology, it is most desirable that the PN junction be passivated, that it can be made by selective diffusion and that all connections are on the upper surface. The structure of the active element provided by this invention meets all of these requirements.

In transistors constructed according to this invention, the intrinsic stand-off ratio $\eta$ is independent of emitter placement, as will be explained.

The magnitude of $\eta$ is determined by $d_1$ and $d_2$. It has been found that the standoff ratio is defined by:

$$\eta \cong \frac{d_2}{d_1+d_2}$$

The absence of terms involving the emitter region indicates that the emitter region may be placed anywhere and this selection is practically the case so long as it is placed a few base diameters from either base region and far enough from the edge of the die so that severe extra recombination and other effects are not introduced. How far the emitter must be away from the base region depends on the permissible tolerance of the standoff voltage, as will be explained.

Figure 4:
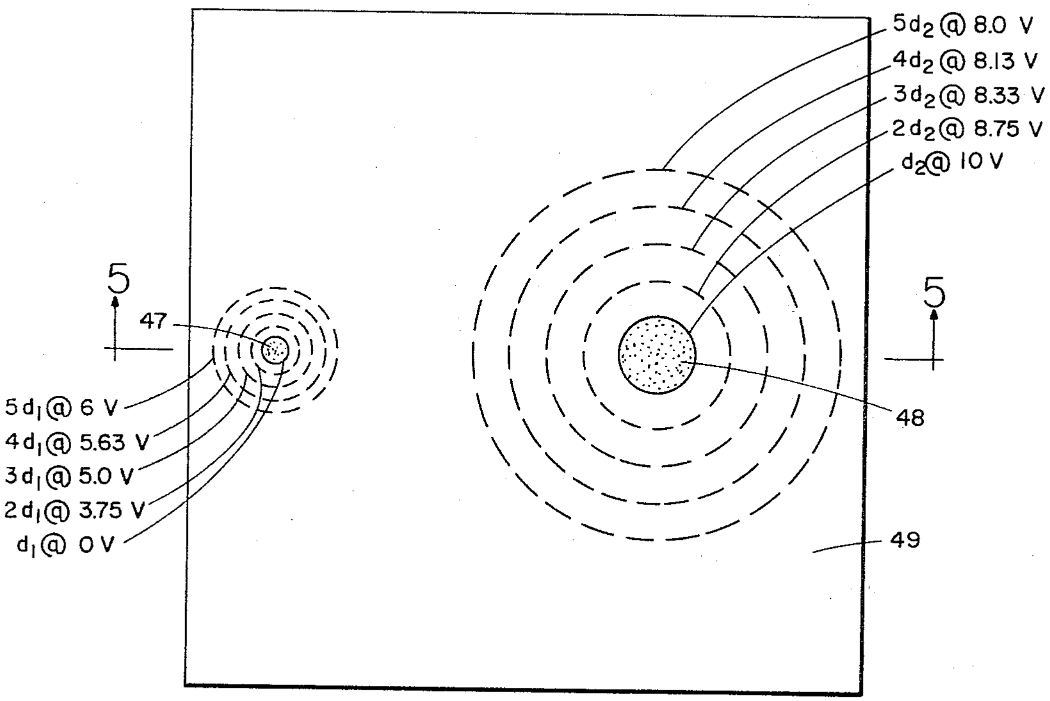
FIG. 4 is a top view of the active element of FIG. 2 showing the equipotential lines at the surface of the semiconductor.

Why the relationship discussed above regarding emitter region placement is true is shown graphically by reference to FIG. 4 which represents a structure having two base hemispheres 47 and 48 which are good conductors on a wafer of high resistivity silicon material 49. When a potential difference is maintained between the hemispheres, equipotential lines (dashed lines) form approximately as shown. The potential difference between any two equipotential lines of a given separation is relatively large when they are near a conductor and very much smaller for the same separation at some substantially greater distance from a conductor so that for random points some distance from both conductors, very little potential difference exists from point to point. If, as in FIG. 4, for example, a potential difference of 10 volts exists between the two conductors in which the first conductor 47 has a diameter $d_1$ and the second conductor 48 has a diameter $d_2=3d_1$, the equipotential lines having diameters $2d_1$, $3d_1$, $4d_1$ and $5d_1$ about the first conductor and those having diameters $2d_2$, $3d_2$, $4d_2$ and $5d_2$ about the second conductor will have the values shown on FIG. 4. As can be seen from FIG. 4, in the area or region outside of $5d_1$ and $5d_2$ the potential of a point with respect to base hemisphere $B_1$ of 47, which is at zero volts, will be between 6 and 8 volts. The area outside of $5d_1$ and $5d_2$ will in fact have a potential of 7½ volts with a tolerance of +½ volt, —3/2 volts (or a two volts range), the 7½ volts being in accordance with the relationship $$\eta \cong \frac{d_2}{d_1+d_2}$$

Obviously if a two volt tolerance for standoff voltage is too great, it may be reduced by limiting the position of the emitter region to a location outside of potentials which are greater than $5d_1$ and $5d_2$. For example, in a device in which the emitter location were to be outside of $10d_1$ and $10d_2$, the range of possible values of $V_P$ is only 7½ volts with a tolerance of +.25 volt and —.75 volt (or two volt range). Thus it is only necessary to position the emitter region anywhere outside of $10d_1$ and $10d_2$ and the standoff voltage (neglecting $V_D$) will lie between 6.75 volts and 7.75 volts with respect to base $B_1$. In the general case, for any unijunction transistor in accordance with this invention, choosing to locate the emitter in the area outside of any given pair of equipotentials of diameters $Nd_1$ and $Nd_2$, where N is a real number, will reduce the tolerance range on $V_P$ to a value less than that imposed by the pair of equipotentials. In other words, the larger N is made; the smaller the variation in $V_P$ as the emitter region is selected to be formed at different areas. Further, it is difficult to predict the exact value of $\eta$ for an arbitrary device geometry since the relationship between $\eta$, $d_1$ and $d_2$ is approximate. However, $\eta$ variation among these devices, when manufactured in the same manner and having the same geometry, is very small so that any final adjustment of $\eta$ may readily be made by slightly changing the diameter of one or both of the base regions.

Figure 5:
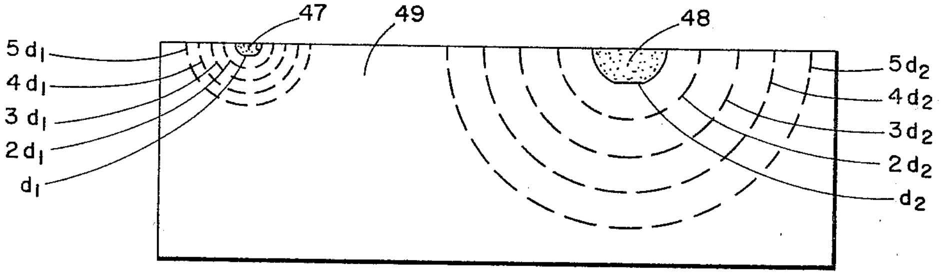
FIG. 5 is a sectional view of FIG. 4 at line 5—5 showing the equipotential lines within the volume of the semiconductor.

FIG. 5 is a section through FIG. 4 at line 5—5 to show the equipotentials in depth, which are, of course, equipotential surfaces within the bulk of the semiconductor material. Note that the opposite side of the wafer, like most of the surface shown in FIG. 4, is also at some voltage amplitude near 7½ volts. An emitter region may be placed on the opposite side of the wafer and the standoff voltage may still be set by appropriately choosing the ratio of the base diameters. Where a rather thin wafer is used, the equipotential surfaces will, of course, be flattened near the lower face but this will not seriously affect the standoff ratio or standoff voltage.

Figure 6:
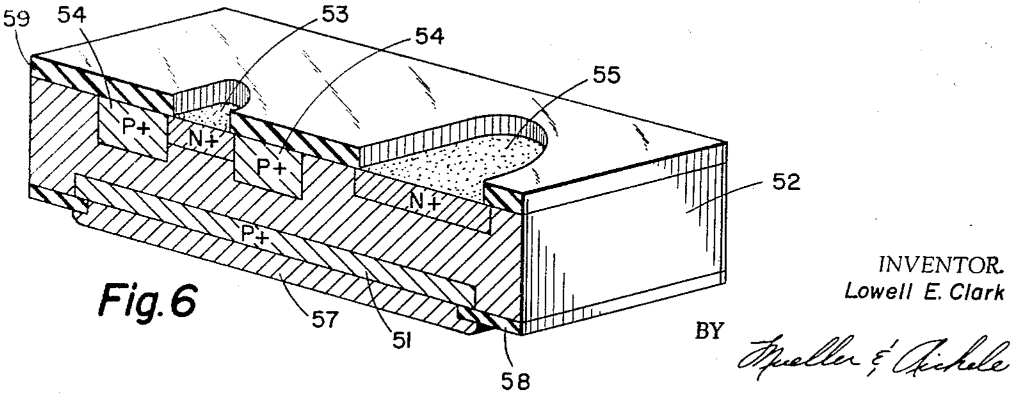
FIG. 6 is a sectional view of a unijunction transistor also in accordance with this invention. The device is symmetrical about the plane of the section.

A number of possible configurations based on the above principles are possible. For example, FIG. 6 shows a sectional symmetrical structure, in which the P type emitter region 51 has been formed on the reverse side of a high resistivity N type wafer 52. To limit the size of the base $B_1$, shown at 53, and at the same time minimize interbase surface leakage or reverse current effects across the high resistivity N region surface which might alter device parameters, a P+ region 54 as shown may be diffused into the wafer. This is a heavily doped doughnut shaped region which by compensating effectively minimizes any widening out of the N+ region during the N+ diffusion cycle and permits a smaller diameter N+ region to be prepared than could ordinarily be prepared by ordinary selective diffusion techniques. It would not be necessary to so treat the other base $B_2$ or region 55 in designs where it is substantially larger in diameter than base $B_1$.

The diffused emitter region 51 is circular and has been sectioned across its diameter in FIG. 6; it has a metal film 57 across its surface which provides a large area connection which also provides a good heat path when the emitter is bonded to a header body and therefore aids in keeping the device cooler during its operation. The edges of the emitter region 51 lie beneath the silicon dioxide film 58 so that the junction is protected and passivated. Metal electrodes connecting the two base region, and the upper silicon dioxide passivating film are not shown so that the underlying structure may be seen more clearly. The passivating oxide film 59 covers all of the upper surface except for small openings immediately over each diffused base region through which the metal base electrodes make contact to them.

In an embodiment of the unijunction structure shown in FIGS. 2 and 3, the following materials and dimensions are used. The die is of monocrystalline 20 ohm-centimeter N type silicon and was cut from a wafer having a minimum lifetime of 20 microseconds and which was lapped and polished to a final thickness which is the same as for the die. The die size is about 25 mils square by about 8 mils thick. The smaller base 37 ($B_1$) is about 0.5 mils in diameter, and the larger base 38 ($B_2$) is about 2.0 mils in diameter. Both bases were formed simultaneously by the selective diffusion of phosphorus into readion 27, each base region having a surface concentration of N type impurity of about $10^{21}$ atoms per cubic centimeter and a depth of about 1 micron. The center-to-center spacing of the base regions is about 15 mils.

The emitter region was formed by selectively diffusing boron into the wafer to form a PN junction at a depth of about 3 microns; the region has a surface concentration of about $10^{19}$ atoms per cubic centimeter. The emitter is a circular segment about the center of base 37 ($B_1$) as shown. The inside edge of the emitter junction is spaced about 5 mils from the center of base $B_1$ or region 37. The semicircular segment is about 180° and is approximately 3 mils wide. The passivating oxide is a thermally grown silicon oxide film formed by oxidizing the silicon in an oxygen atmosphere at a temperature of about 1100° C. In the completed device it will contain boron and phosphorus from the various selective diffusion steps. The film is about 10,000 angstrom units thick where it covers the surface portion of the PN junction. The device has an $\eta$ of about 0.80 and a reverse current $I_{eo}$ which typically is less than 100 nanoamperes.

The devices are prepared in quantity on silicon wafers using well-known photolithographic and selective diffusion techniques. Since the device is only .025 inch square, approximately 1600 unijunction transistors may be prepared on each square inch of useable surface on each silicon wafer at a cost several times less than of comparable alloy junction devices which must be several times larger in order to provide space enough to locate the emitter.

The basic unijunction transistor in accordance with this invention offers considerable design versatility. For example, the temperature coefficient of resistance for the interbase region may be reproducibly controlled by introducing various impurities during diffusion. One may achieve temperature dependence very similar to that of the conventional alloy type structure in which the interbase resistance approximately doubles from room temperature to 150° C. by maintaining the original bulk silicon resistivity so that lattice scattering effects dominate the temperature dependence of $R_{BB}$. At high room temperature the resistance between base regions $R_{BB}$ may be obtained if the bulk silicon is compensated with deep-lying impurities; in this case the resistance falls with increasing temperature because of the dominance of thermal generation of carriers. The characteristics of prior art unijunction transistors may be accurately reproduced in these newer devices if the diffusions and device geometry are properly designed, and therefore, the less desirable prior art devices may be directly replaced by them.

The total bulk recombination in the device is less than in comparable prior devices due to the small size of the die and the rather close spacing of the bases. The total surface recombination is also less because there is relatively little surface between the emitter and the base $B_1$, and because the passivating oxide film has reduced the surface recombination velocity. The surface recombination velocity for the oxide coated silicon is at least an order of magnitude less than what would be considered, from a production standpoint, reproducible unpassivated low surface recombination velocity silicon. The over-all reduction in carrier recombination results in improved conductivity modulation such that while the device is "on" the voltage drop between emitter and base will average less and the device will be able to handle more current without overheating than if this were not the case.

Additionally, the passivating oxide film maintains the surface recombination velocity within such a narrow range that it may be considered fixed for practical purposes. This results in a very reliable device inasmuch as surface sensitive parameters are now stabilized.

The passivating film results in a satisfactory $I_{eo}$ value for almost every device manufactured so that there are fewer devices rejected for $V_P$ not within specification and this of course further reduces the net cost of the finished unijunction transistor.

As is apparent, unijunction transistors in accordance with this invention are superior to prior unijunction transistors in that they may be manufactured at a lower cost, can handle more current, are more reproducible, demonstrate a smaller percentage of manufacturing rejects, and are devices of substantially greater reliability.

I claim:

1. A unijunction transistor having a high resistivity body consisting of first semiconductive type material with a major surface and a pair of base regions formed in said body of the same conductivity type but of lower resistivity and intersecting said major surface of said body in respective circular configurations on said major surface and having substantially different diameters with an intrinsic standoff ratio formed in said transistor that is defined as the ratio of a larger base surface diameter divided by the sum of said diameters, an additional semiconductor region extending into said body from said major surface and consisting of a semiconductive material of opposite conductivity type from said first type for forming a rectifying junction with said body and located on said major surface from said base regions by several of said surface diameters, respectively, and all semiconductor material disposed between said base regions being of said first type material with a high resistivity.

2. A semiconductor structure for functioning as a unijunction transistor including in combination, a body of high resistivity first conductivity type semiconductive material having a major surface and with first and second spaced apart base regions formed therein of lower resistivity but of the same semiconductive type material having mutually exclusive surface portions of said body with said first and second regions respectively having a first and second length respectively on said surface portions, and an emitter region of opposite conductivity type material extending into said body from said surface, said emitter region located in said body remote as measured on said body surface from said base regions by several times said second length and such that said emitter region has no portions lying between said base regions.

3. The structure of claim 2 wherein said base regions mutually exclusive surface portions are circular and said first and second lengths are first and second diameters, respectively, with said second diameter being substantially longer than said first diameter whereby a standoff ratio in the structure is determined by the said second diameter being divided by the sum of said diameters.

4. A transistor having two rectifying junctions, said transistor comprising a body of high resistivity one conductivity type semiconductor material having major faces, first and second base regions formed into said body from one major face of said body, and formed of the same type of material and having a lower resistivity than said body, said base regions having mutually-exclusive spaced-apart circular areas on said one major face with substantially different diameters, an emitter region formed in said body and extending inwardly from said one major face and having an opposite conductivity type material and formed circumferentially about and spaced from said first base region which has a small diameter with respect to a diameter of said second base region on said one major face and forming a rectifying junction with said body, all semiconductor material within said body disposed between said base regions being said high resistivity one conductivity type material of said body, and another emitter region having opposite conductivity type material formed into said body from another major face of said body and forming a rectifying junction therewith.

5. A unijunction semiconductor structure including in combination a semiconductor body of high resistivity first conductivity type material with a major face, first and second base regions formed under said major face of said semiconductor body and formed of the same conductivity type material but having a lower resistivity than said body, an emitter region of opposite conductivity type material with respect to said first type material forming a rectifying junction with said body which extends to said major face, said emitter region being formed in spaced apart relationship to said base regions at said major face such that no portion of said emitter region lies intermediate said base regions at said surface, all semiconductor material disposed between said base regions within said body being of said high resistivity first conducitvity type material as that forming said body, said base regions forming mutually exclusive circular areas on said major face, and a film of metallic oxide on said major face covering said rectifying junction.

References Cited

UNITED STATES PATENTS 3,183,128 5/1965 Leistiko ---------- 148—186

JOHN W. HUCKERT, *Primary Examiner.*

M. EDLOW, *Assistant Examiner.*